(12) United States Patent
Yamaguchi

(10) Patent No.: US 9,538,634 B2
(45) Date of Patent: Jan. 3, 2017

(54) PRINTED CIRCUIT BOARD

(71) Applicant: CANON KABUSHIKI KAISHA, Tokyo (JP)

(72) Inventor: Hiroyuki Yamaguchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 178 days.

(21) Appl. No.: 13/960,469

(22) Filed: Aug. 6, 2013

(65) Prior Publication Data

US 2014/0049929 A1 Feb. 20, 2014

(30) Foreign Application Priority Data

Aug. 16, 2012 (JP) ................................. 2012-180464

(51) Int. Cl.
*H05K 1/18* (2006.01)
*H05K 1/02* (2006.01)

(52) U.S. Cl.
CPC .......... *H05K 1/0216* (2013.01); *H05K 1/0231* (2013.01); *H05K 1/0245* (2013.01); *H05K 1/0233* (2013.01); *H05K 2201/0792* (2013.01); *H05K 2201/09272* (2013.01); *H05K 2201/09418* (2013.01); *H05K 2201/10522* (2013.01); *H05K 2201/10636* (2013.01); *Y02P 70/611* (2015.11)

(58) Field of Classification Search
CPC ....... H05K 1/0231–1/0234; H05K 201/09309; H05K 201/09336; H05K 201/10545
USPC ........ 361/760–765, 782–785, 777, 792–795; 333/12–14, 122–125
See application file for complete search history.

(56) References Cited

U.S. PATENT DOCUMENTS

| | | | |
|---|---|---|---|
| 7,545,652 B2 | 6/2009 | Yamaguchi | |
| 7,916,497 B2 | 3/2011 | Yamaguchi | |
| 2004/0119553 A1* | 6/2004 | Nishimura | ................. 333/22 R |
| 2009/0206962 A1* | 8/2009 | Chou et al. | ................. 333/28 R |
| 2010/0039784 A1* | 2/2010 | Hayashi | ........................ 361/777 |
| 2010/0283124 A1* | 11/2010 | Ohmae et al. | ................ 257/532 |
| 2010/0284452 A1* | 11/2010 | Allen | ............................ 375/220 |
| 2011/0063790 A1* | 3/2011 | Park et al. | ............... 361/679.31 |
| 2011/0187440 A1 | 8/2011 | Yamaguchi | |

FOREIGN PATENT DOCUMENTS

JP 4-372213 A 12/1992

* cited by examiner

*Primary Examiner* — Tuan T Dinh
(74) *Attorney, Agent, or Firm* — Fitzpatrick, Cella, Harper & Scinto

(57) ABSTRACT

A printed circuit board (e.g., 103) includes capacitor elements (e.g., 121 and 122). The capacitor element (e.g., 121) returns a common mode current included in a signal output from a signal output terminal (e.g., 111) of a semiconductor element (e.g., 102), to a ground terminal (e.g., 113) of the semiconductor element (e.g., 102). The capacitor element (e.g., 122) returns a common mode current included in a signal output from a signal output terminal (e.g., 112) of the semiconductor element (e.g., 102), to the ground terminal (e.g., 113) of the semiconductor element (e.g., 102). The capacitor elements (e.g., 121 and 122) are arranged such that the mutual inductance between a parasitic inductance of the capacitor element (e.g., 121) and a parasitic inductance of the capacitor element (e.g., 122) for the common mode currents is a negative value. Accordingly, the effective inductances of the first and second capacitor elements for the common mode currents are reduced, which suppresses radiation noise.

17 Claims, 14 Drawing Sheets

$L_{eff} = L_1 + L_2 - 2M$

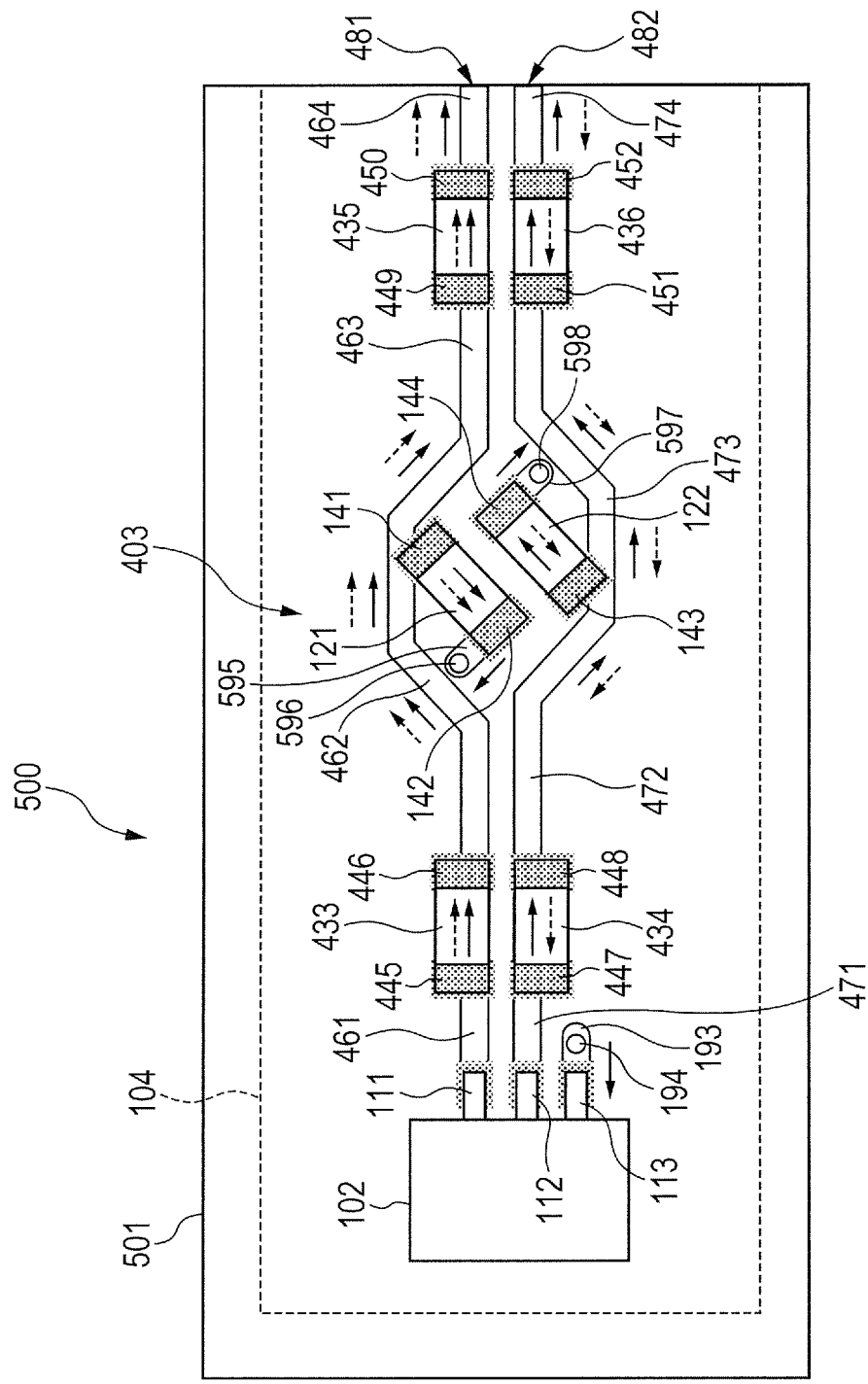

$L_{eff} = L_1 + L_2 + 2M$

PRINTED CIRCUIT BOARD

BACKGROUND OF THE INVENTION

Field of the Invention

The present invention relates to a printed circuit board that is provided in an electronic apparatus and is used for data transmission according to a differential signaling system.

Description of the Related Art

In an electronic apparatus typified by a copier and a digital camera, data transmission rate has been enhanced in the electronic apparatus to achieve printing speed enhancement and high resolution image quality. To support the enhancement, data transmission rate is required to be improved. To achieve the improvement, it is necessary to increase the signal transmission frequency and increase the switching speeds of devices used for signal transmission. As a result, it is difficult for a conventional single-ended signaling to keep radiation noise below or at a limit value. Thus, changeover to a differential signaling system has been made.

The differential signaling system allows currents to flow in a pair of differential signaling lines in opposite phase. Accordingly, magnetic fields cancel each other. The cancellation is advantageous for reduction in radiation noise. Thus, the system has been widespread. However, in actuality, even the differential signaling system cannot eliminate radiation noise.

In general, in the differential signaling system, even if the electric properties of the pair of the differential signaling lines are designed to have the same configuration, radiation noise occurs. It is known that the cause is current components of differential signals with the same phase occurring in the inside of the semiconductor element that transmits the differential signals.

The current components in the same phase (in-phase current), i.e., common mode currents, are caused by a switching time lag between differential signals in a semiconductor element that transmits the differential signals, and a difference in rising and dropping characteristics of signal waveforms. The common mode currents are a main factor of causing radiation noise specific to the differential signaling system.

Current components with opposite phases (opposite phase current), i.e., differential mode currents, cancel each other's magnetic fields occurring therein. The cancellation exerts an advantageous effect of suppressing radiation noise. In contrast, common mode currents intensify each other's magnetic fields occurring therein. Accordingly, the intensification functions to increase radiation noise.

If a route for common mode currents returning to a semiconductor element for transmitting differential signals, which is a generation source thereof, is not secured, the current strays in various conductors residing in the electronic apparatus and returns to the semiconductor element through a stray capacitance of a printed wiring board. The electromagnetic fields caused by the straying common mode currents are measured as large radiation noise.

A conventional filter circuit described in Japanese Patent Application Laid-Open No. H04-372213 can rapidly return the common mode currents to the semiconductor element, and suppress radiation noise. FIG. 15 schematically illustrates a filter circuit proposed in Japanese Patent Application Laid-Open No. H04-372213.

In FIG. 15, a transmission semiconductor element 1 and a reception semiconductor element 21 transmit signals through wirings (differential signal wirings) 5 and 6 that transmit differential signals. On the differential signal wirings 5 and 6, a filter circuit 10 is provided in proximity to the transmission semiconductor element 1. The filter circuit 10 is connected to the reception semiconductor element 21 by cables 18 and 19, which are portions of the differential signal wirings 5 and 6. The filter circuit 10 includes: a capacitor element 7 arranged in electrical connection between a ground and the wiring 5 connected to a first signal output terminal 2 of the semiconductor element 1; and a capacitor element 8 arranged in electrical connection between the ground and the wiring 6 connected to a second signal output terminal 3 of the semiconductor element 1. A ground terminal 4 of the semiconductor element 1 is connected to the ground. The paths of common mode currents indicated by arrows in FIG. 15 pass through the wirings 5 and 6 and the capacitor elements 7 and 8 and return to the ground terminal 4. Such a configuration suppresses radiation noise from the cables 18 and 19, which are differential signaling lines.

In FIG. 15, the filter circuit 10 further includes inductor elements 13 and 14 and a capacitor element 15 to attenuate harmonic components of differential mode currents, thereby maintaining signal quality. A terminating resistor 20 is provided on output sides of the cables 18 and 19. In the filter circuit 10 illustrated in FIG. 15, chip-shaped capacitor elements excellent in high frequency property can be adopted as the capacitor elements 7 and 8.

A typical capacitor element used in the filter-circuit illustrated in FIG. 15 has an inductance due to a parasitic inductance caused by an electrode structure. The inductance due to the parasitic inductance is a significantly small value, which is several nanohenries. Accordingly, the inductance has caused no problem.

However, as the driving frequency for an electronic apparatus has been increased in recent years, a band causing a problem of radiation noise has expanded to a high frequency band. Accordingly, even a slight inductance of a capacitor element causes a problem of degrading the filter characteristics of a filter circuit. Furthermore, a high density packaging of a printed circuit board is also a factor of enhancing degradation in the filter characteristics of the filter circuit.

Thus, the present invention has an object to provide a printed circuit board that reduces the effective inductances of first and second capacitor elements with respect to common mode currents flowing in first and second capacitor elements to suppress radiation noise.

SUMMARY OF THE INVENTION

According to an aspect of the present invention, a printed circuit board includes: a printed wiring board; a semiconductor element mounted on the printed wiring board and having a ground terminal connected to a ground, and a first signal output terminal and a second signal output terminal outputting differential signals; a first and second differential signal wirings connected to the first and second signal output terminals of the semiconductor element, respectively, and transmitting differential signals; a first capacitor element arranged between the first differential signal wiring and a ground, and having a first terminal connected to the first differential signal wiring and a second terminal connected to a ground; and a second capacitor element arranged between the second differential signal wiring and a ground, and having a third terminal connected to the second differential signal wiring and a fourth terminal connected to a ground, wherein the first capacitor element and the second capacitor element are arranged such that the first terminal of the first capacitor element and the fourth terminal of the second capacitor element face each other, and the second terminal of the first capacitor element and the third terminal of the second capacitor element face each other.

Further features of the present invention will become apparent from the following description of exemplary embodiments with reference to the attached drawings.

BRIEF DESCRIPTION OF THE DRAWINGS

FIG. 10 is a plan view of a schematic configuration of a printed circuit board according to a fifth embodiment.

DESCRIPTION OF THE EMBODIMENTS

Preferred embodiments of the present invention will now be described in detail in accordance with the accompanying drawings.

First Embodiment

Figure 1A:
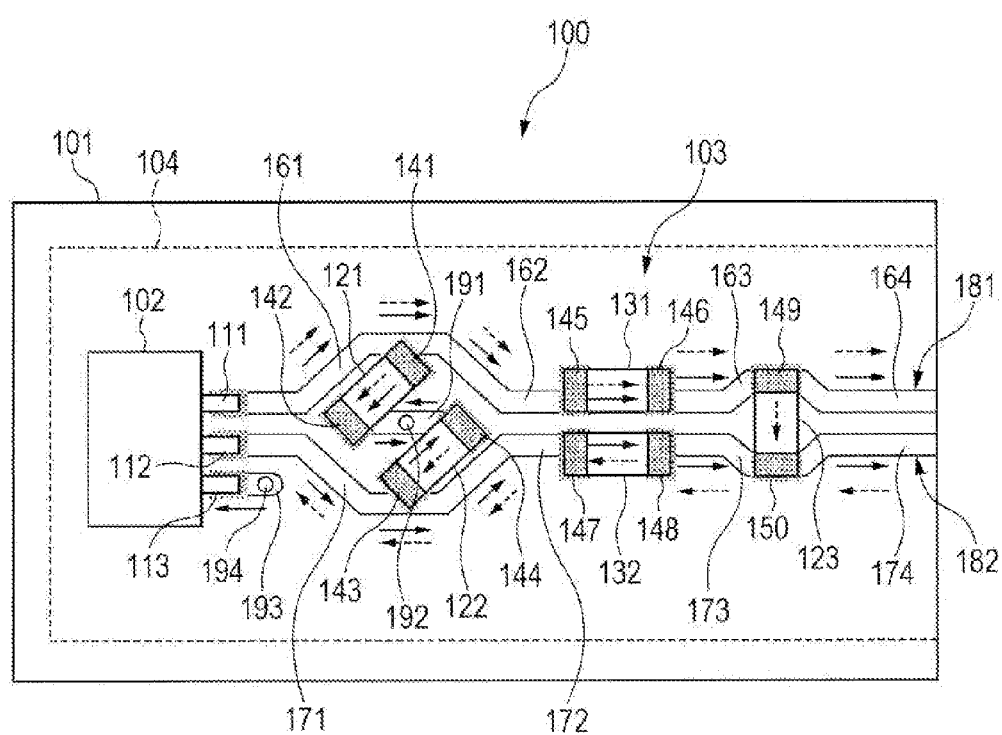
FIG. 1A is a diagram illustrating a schematic configuration of a printed circuit board according to a first embodiment.

FIG. 1A is a diagram illustrating a schematic configuration of a printed circuit board according to a first embodiment of the present invention. FIG. 1A is a plan view illustrating a printed circuit board.

In FIG. 1A, the printed circuit board 100 includes: a printed wiring board 101; a semiconductor element 102 mounted on the printed wiring board 101; and a filter circuit 103 mounted on the printed wiring hoard 101. The printed wiring board 101 is a multilayer printed wiring board. The semiconductor element 102 and the filter circuit 103 are mounted on a surface layer of the printed wiring board 101. A solid ground pattern 104 is arranged in an inner layer of the printed wiring board 101; this layer is different from the surface layer.

The semiconductor element 102 includes: a signal output terminal 111, which is a first signal output terminal; a signal output terminal 112, which is a second signal output terminal; and a ground terminal 113. This element outputs differential signals with opposite phases from the respective signal output terminals 111 and 112. In FIG. 1A, opposite phase currents (differential mode currents) are indicated by broken line arrows, and in-phase currents (common mode currents) are indicated by solid line arrows.

The filter circuit 103 includes a capacitor element (first capacitor element) 121 and a capacitor element (second capacitor element) 122. The capacitor elements 121 and 122 are, for instance, chip type capacitor elements. The capacitor element 121 returns the common mode current included in a signal output from the signal output terminal 111 of the semiconductor element 102, to the ground terminal 113 of the semiconductor element 102. The capacitor element 122 returns the common mode current included in the signal output terminal 112 of the semiconductor element 102, to the ground terminal 113 of the semiconductor element 102.

The capacitor element 121 includes: a terminal 141, which is a first terminal; and a terminal 142, which is a second terminal. The capacitor element 122 includes: a terminal 143, which is a third terminal; and a terminal 144, which is a fourth terminal.

The filter circuit 103 includes an inductor element (a first inductor element) 131, an inductor element (second inductor element) 132, and a capacitor element 123 (third capacitor element). The inductor elements 131 and 132 are, for instance, chip type inductor elements. The capacitor element 123 is, for instance, a chip type capacitor element. In this first embodiment, the filter circuit 103 functions as a n-type low-pass filter connected to the terminals 111 and 112 of the semiconductor element 102. Accordingly, the capacitor elements 121 and 122 are capacitor elements on a signal input side for the respective inductor elements 131 and 132. The capacitor element 123 is a capacitor element on a signal output side for the inductor elements 131 and 132. The filter circuit 103, which is a n-type low-pass filter, attenuates a harmonic component of the differential signal (differential current).

The inductor element 131 includes: a terminal 145, which is a fifth terminal; and a terminal 146, which is a sixth terminal. The inductor element 132 includes: a terminal 147, which is a seventh terminal; and a terminal 148, which is an eighth terminal. The capacitor element 123 includes: a terminal 149, which is a ninth terminal; and a terminal 150, which is a tenth terminal.

The printed wiring board 101 includes a wiring pattern (first signal wiring pattern) 161 formed of a conductor that electrically connects the signal output terminal 111 of the semiconductor element 102 to the terminal 141 of the capacitor element 121. The printed wiring board 101 includes a wiring pattern 162 formed of a conductor that electrically connects the terminal 141 of the capacitor element 121 to the terminal 145 of the inductor element 131. The printed wiring board 101 further includes a wiring pattern 163 formed of a conductor that electrically connects the terminal 146 of the inductor element 131 to the terminal 149 of the capacitor element 123. The printed wiring board 101 includes a wiring pattern 164 formed of a conductor that electrically connects the terminal 149 of the capacitor element 123 to a connector terminal, not illustrated.

Furthermore, the printed wiring board 101 includes a wiring pattern (second signal wiring pattern) 171 formed of a conductor that electrically connects the signal output terminal 112 of the semiconductor element 102 to the terminal 143 of the capacitor element 121. The printed wiring board 101 includes a wiring pattern 172 formed of a conductor that electrically connects the terminal 143 of the capacitor element 122 to the terminal 147 of the inductor element 132. The printed wiring board 101 includes a wiring pattern 173 formed of a conductor that electrically connects the terminal 148 of the inductor element 132 to the terminal 150 of the capacitor element 123. The printed wiring board 101 further includes a wiring pattern 174 formed of a conductor that electrically connects the terminal 150 of the capacitor element 123 to a connector terminal, not illustrated.

The wiring patterns 161 to 164 configure a differential signal wiring pattern 181 (a first differential signal wiring pattern). The wiring patterns 171 to 174 configure a differential signal wiring pattern 182 (second differential signal wiring pattern). The differential signal wiring pattern 181 and the differential signal wiring pattern 182 are formed line-symmetrically to each other. The differential signal wiring patterns 181 and 182 are arranged in the surface layer of the printed wiring board 101.

In this first embodiment, the line-symmetric configuration between the differential signal wiring pattern 181 and the differential signal wiring pattern 182 define that the lengths of the wiring pattern 161 and the wiring pattern 171 are the same. Accordingly, the impedances of the wiring patterns 161 and 171 (in particular, inductances) are the same.

A connector terminal, not illustrated, of the printed wiring board 101 is electrically connected to a semiconductor element that receives differential signals through a pair of cables, which are differential signaling lines. Accordingly, the differential signals output from the semiconductor element 102 are transmitted to the semiconductor element through the cables. A terminating resistor is provided between the cables and the semiconductor element.

In this first embodiment, the capacitor elements 121 and 122 are arranged between the differential signal wiring patterns 181 and 182. Thus, the capacitor element 121 and the capacitor element 122 are adjacent to each other.

The printed wiring board 101 is arranged in the surface layer, and includes a ground wiring pattern 191 that electrically connects the terminal 142 of the capacitor element 121 to the terminal 144 of the capacitor element 122. The ground wiring pattern 191 is electrically connected to the solid ground pattern 104 by a via 192.

The printed wiring board 101 is arranged in the surface layer, and includes a ground wiring pattern 193 electrically connected to the ground terminal 113 of the semiconductor element 102. The ground wiring pattern 193 is electrically connected to the solid ground pattern 104 by a via 194.

According to the above configuration, the terminal 141 of the capacitor element 122 is electrically connected to the signal output terminal 111 of the semiconductor element 102, and the terminal 142 is electrically connected to the ground terminal 113 of the semiconductor element 102. The terminal 143 of the capacitor element 122 is electrically connected to the signal output terminal 112 of the semiconductor element 102. The terminal 144 is electrically connected to the ground terminal 113 of the semiconductor element 102. Accordingly, the capacitor element 121 can return the common mode current included in the signal output from the signal output terminal 111 of the semiconductor element 102 to the ground terminal 113 of the semiconductor element 102. The capacitor element 122 can return the common mode current included in the signal output from signal output terminal 112 of the semiconductor element 102 to the ground terminal 113 of the semiconductor element 102.

Here, the capacitor elements 121 and 122 have not only capacitance components but also an inductance component due to the parasitic inductance. Thus, the capacitor elements 121 and 122 are arranged with respect to the common mode currents flowing through the respective capacitor elements 121 and 122 such that the mutual inductance between the parasitic inductance of the capacitor element 121 and the parasitic inductance of the capacitor element 122 is a negative value.

In this first embodiment, the capacitor elements 121 and 122 are arranged such that the terminal 141 of the capacitor element 121 and the terminal 144 of the capacitor element 122 face each other and the terminal 142 of the capacitor element 121 and the terminal 143 of the capacitor element 122 face each other.

Accordingly, since the mutual inductance between the parasitic inductance of the capacitor element 121 and the parasitic inductance of the capacitor element 122 with respect to the common mode currents indicated by the solid line arrows is the negative value, the combined inductance for the common mode currents is reduced. Accordingly, the common mode currents are facilitated to return to the ground terminal 113 of the semiconductor element 102 through the respective capacitor elements 121 and 122. The radiation noise from the differential signal wiring patterns 181 and 182 and the cables 105 and 106 can be suppressed.

Figure 12:
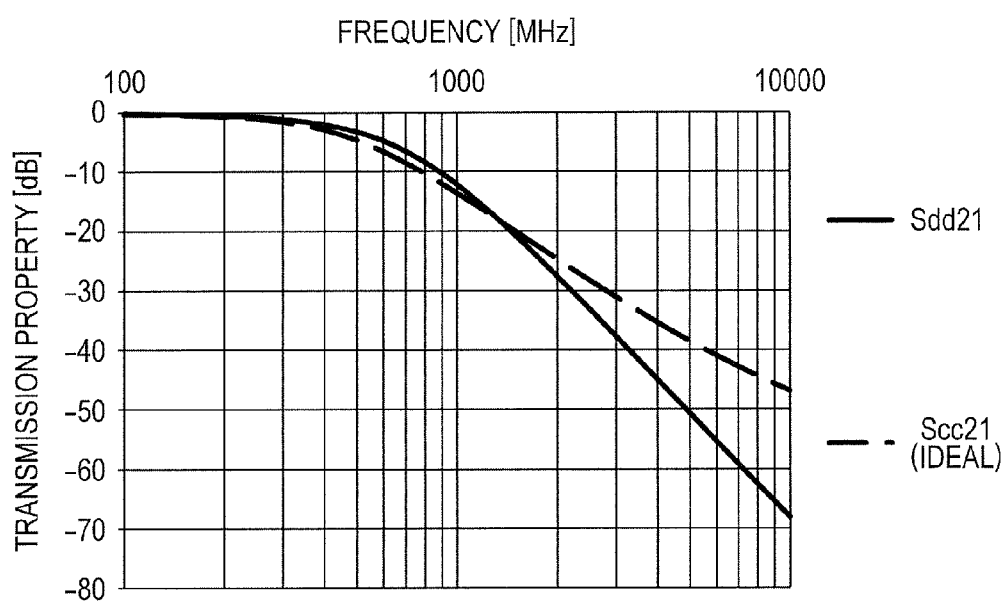
FIG. 12 is a graph illustrating the filter characteristics of a filter circuit in an ideal state in a reference example.

FIG. 12 is a graph illustrating, as a reference example, the filter characteristics of the filter circuit in an ideal state with no parasitic inductance in the capacitor elements 121 and 122. The filter circuit of the reference example is a third order Bessel filter with a cutoff frequency of 500 MHz. The constants of respective elements are configured such that the capacitor elements 121 and 122 have 14 pF, the capacitor element 123 has 1 pF, and the inductor elements 131 and 132 have 15.5 nH. A simulation is performed using AnsoftDesigner by ANSYS, Inc. to calculate the filter characteristics.

In FIG. 12, a solid line indicates the Sdd21 property of the third order Bessel filter, i.e., the transmission property of the opposite phase component, and a broken line indicates the Scc21 property, i.e., the transmission property of the in-phase component. The smaller the transmission property is, the more excellent the attenuation characteristics as the filter circuit is. As is apparent from the Sdd21 property, on the opposite phase component the pass band of data spectrum is limited to a cutoff frequency of 500 MHz or less so as not to cause an intersymbol interference due to a high frequency component unnecessary for signal reproduction in the semiconductor element 107 on the reception side. That is, it is designed so as to secure the amount of attenuation of at least 3 dB in an unnecessary frequency band of 500 MHz or higher. As is apparent from the Scc21 property, it can be understood that also on the in-phase component that is a component unnecessary for signal reproduction in the semiconductor element 107 in the reception side and causes radiation noise, a property of attenuating the high frequencies is configured.

Figure 13:
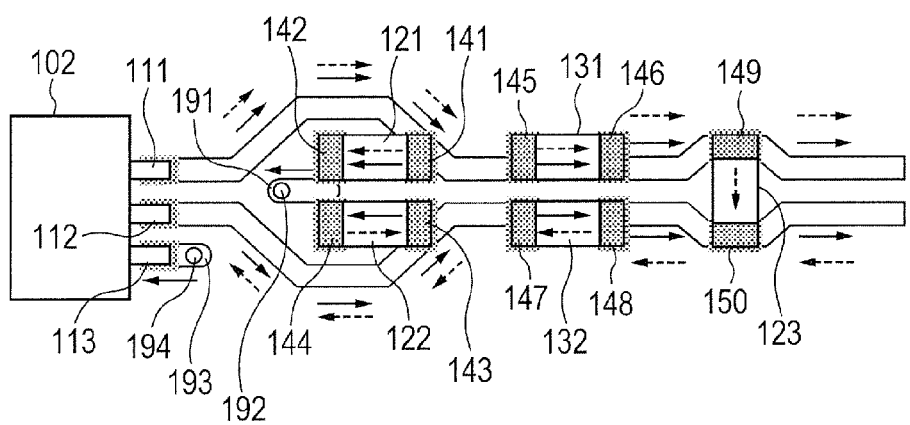
FIG. 13 is a diagram illustrating a schematic configuration of a printed circuit board in a comparative example.

FIG. 13 is a diagram illustrating a schematic configuration of the printed circuit board in a comparative example. The same symbols are assigned to parts having the same configurations as those of this first embodiment. The description thereof is omitted.

In the printed circuit board of the comparative example, the arrangement of the capacitor elements 121 and 122 is reversed from the arrangement of this first embodiment. In FIG. 13, the capacitor elements 121 and 122 are arranged such that the terminal 141 of the capacitor element 121 and the terminal 143 of the capacitor element 122 face each other, the terminal 142 of the capacitor element 121 and the terminal 144 of the capacitor element 122 face each other.

Figure 14A:
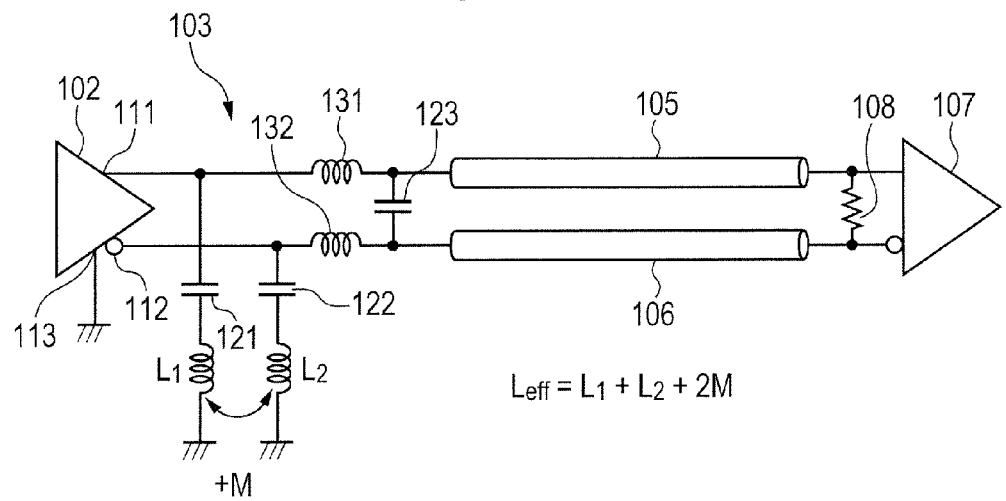
FIGS. 14A and 14B are diagrams illustrating an operation of a differential signaling circuit in the comparative example.
Figure 14B:
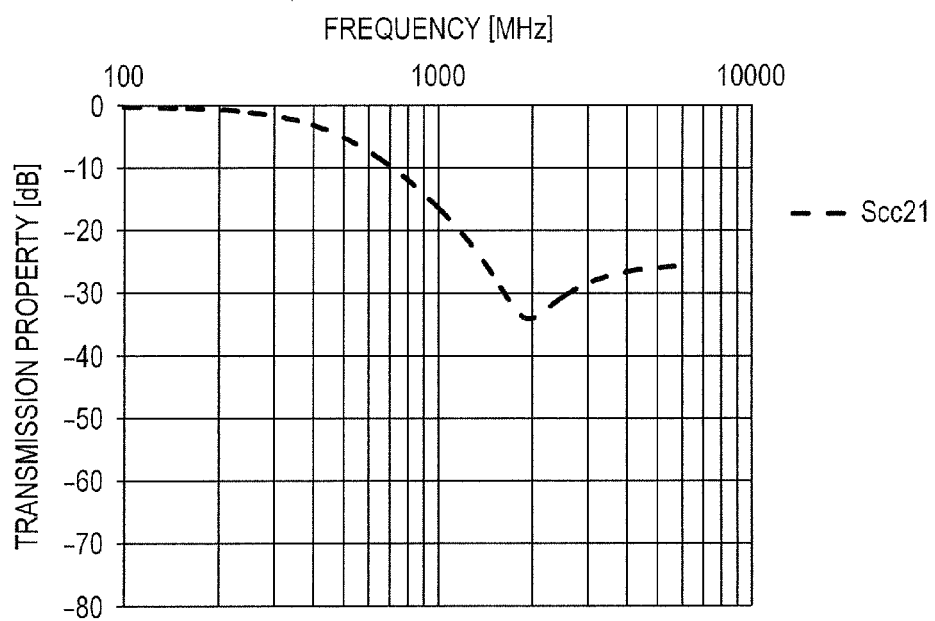
Figure 15:
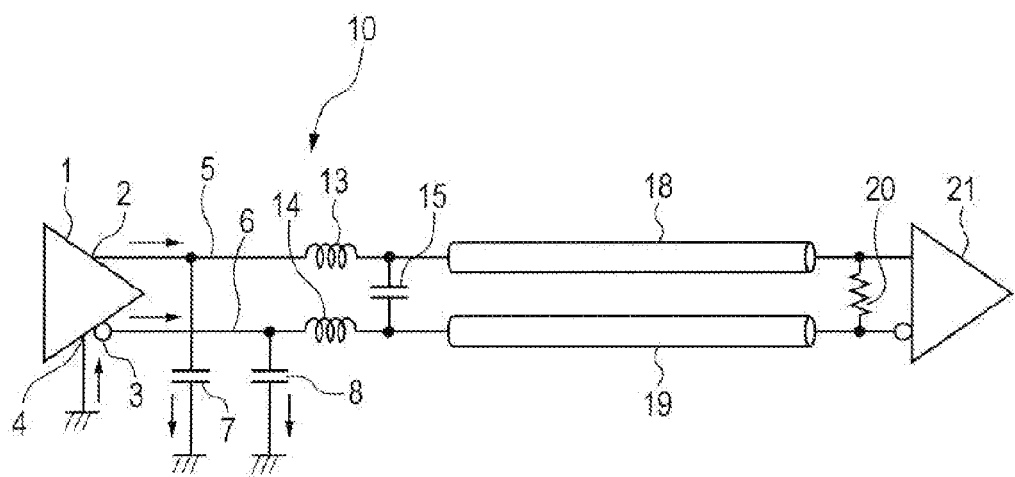
FIG. 15 is a schematic circuit diagram of a differential signaling circuit including a conventional filter circuit.

FIGS. 14A and 14B are diagrams for illustrating an operation of a differential signaling circuit in the comparative example. FIG. 14A is an equivalent circuit-diagram in consideration of an effective inductance $L_{eff}$ in the differential signaling circuit in the comparative example. FIG. 14B is a graph illustrating the filter characteristics of the filter circuit (Scc21 property, i.e., the attenuation characteristics of the in-phase component) of the differential signaling circuit of the comparative example. The characteristics are calculated by performing simulation using AnsoftDesigner by ANSYS, Inc.

The capacitor element 121 and the capacitor element 122 are arranged so as to be adjacent to each other. The mutual inductance between the parasitic inductance of the capacitor element 121 and the parasitic inductance of the capacitor element 122 with respect to the common mode currents is a positive value of +M. The effective inductance $L_{eff}$ is further increased by adding the mutual inductance of +M, which is a positive value, to inductance $L_1$ of the parasitic inductance of the capacitor element 121, and the inductance $L_2$ of the parasitic inductance of the capacitor element 122. The effective inductance $L_{eff}$ is represented by the following the Expression 1.

$$L_{eff} = L_1 + L_2 + 2M \quad \text{(Expression 1)}$$

The constants of the elements are configured such that the capacitor elements 121 and 122 have 14 pF, and the capacitor element 123 has 1 pF, and the inductor elements 131 and 132 have 15.5 nH. It is configured such that 1608 size components are adopted as the chip type capacitor elements 121 and 122, and the mounting interval thereof is 0.5 mm; the effective inductance $L_{eff}$ is calculated as 0.25 nH.

In this example, as illustrated in FIG. 14B, in a frequency band of 2 GHz or higher, the attenuation characteristics are degraded due to adverse effects of the inductance component of the parasitic inductance. In particular, it can be understood that, in a band of 2.8 GHz or higher, the characteristics are largely degrades in comparison with the ideal state without consideration of the inductance component.

Figure 2A:
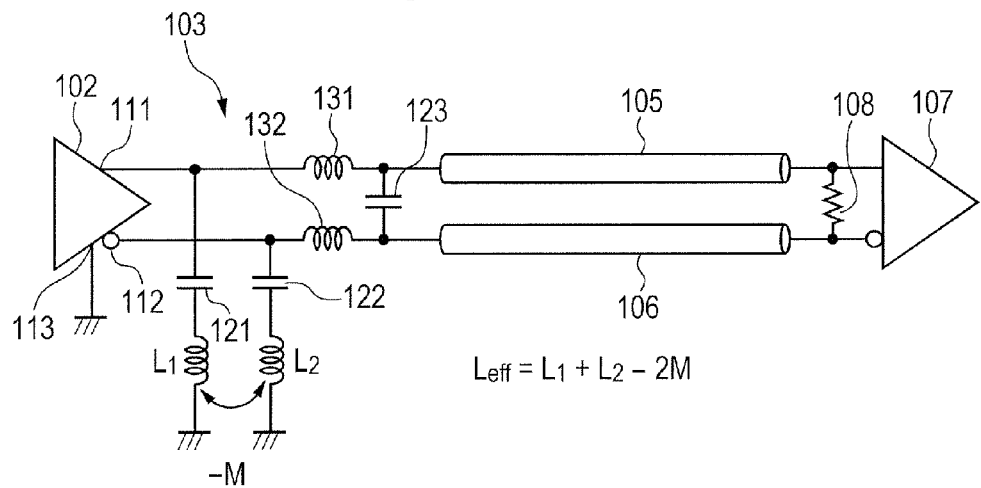
FIGS. 2A and 2B are diagrams for illustrating an operation of a differential signaling circuit of the first embodiment.
Figure 2B:
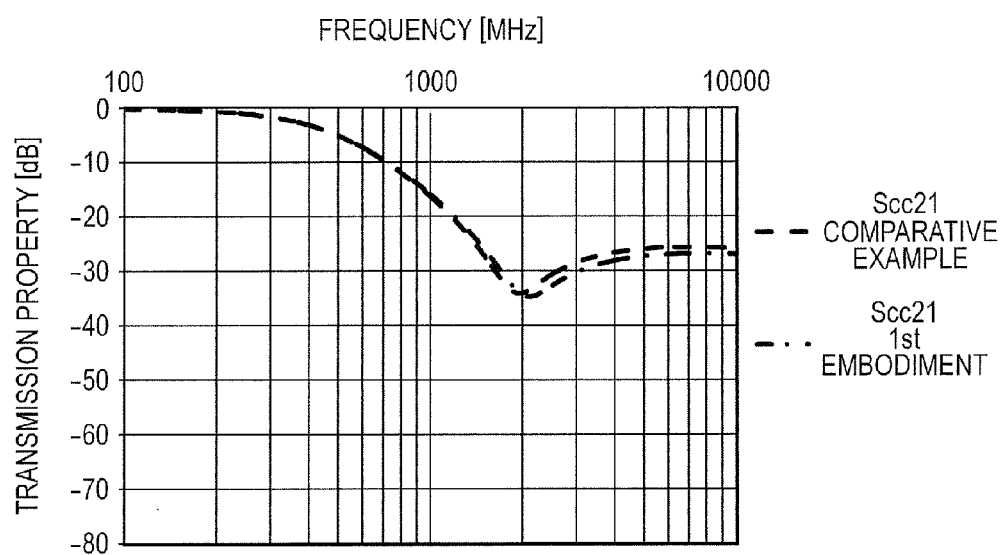

FIGS. 2A and 2B are diagrams for illustrating an operation of the differential signaling circuit of the first embodiment. FIG. 2A is an equivalent circuit diagram in consideration of the effective inductance $L_{eff}$ in the differential signaling circuit in the first embodiment. FIG. 2B is a graph illustrating the filter characteristics of the filter circuit (Scc21 property, i.e., the attenuation characteristics in the in-phase component) in the differential signaling circuit of the first embodiment.

In this first embodiment, as to the differential mode currents indicated by the broken line arrows in FIG. 1A, the directions of currents at the capacitor elements 121 and 122 are the same. Accordingly, the mutual inductance is a positive value of +M, which increases the effective inductance $L_{eff}$. As a result, the differential mode currents to the capacitor elements 121 and 122 are difficult to flow. Accordingly, adverse effects on a signal waveform to be originally transmitted can be suppressed small.

In contrast, as to the common mode currents indicated by the solid line arrows in FIG. 1A, the directions of the currents of the capacitor elements 121 and 122 are opposite to each other. Accordingly, the mutual inductance is a negative value of −M, which reduces the effective, inductance $L_{eff}$. As a result, the reduction facilitates the common mode currents to the capacitor elements 121 and 122 to flow. Accordingly, propagation of the common mode currents, which causes radiation noise, to the cables 105 and 106 is reduced, and can return to the ground terminal 113 of the semiconductor element 102 through the ground.

That is, the effective inductance $L_{eff}$ for the common mode currents is represented by the following Expression 2.

$$L_{eff} = L_1 + L_2 - 2M \quad \text{(Expression 2)}$$

Here, for instance, in the case where the capacitor elements 121 and 122 are arranged at an interval of 1 mm so as to avoid the ground wiring pattern 191 and the via 192, the effective inductance $L_{eff}$ is calculated as 0.217 nH. The filter circuit 103 illustrated in FIG. 2A is a third order Bessel filter with a cutoff frequency of 500 MHz. The constants of the elements are configured such that the capacitor elements 121 and 122 have 14 pF, the capacitor element 123 has 1 pF, and the inductor elements 131 and 132 have 15.5 nH. A simulation is performed using AnsoftDesigner by ANSYS, Inc. to calculate filter characteristics illustrated in FIG. 2B. FIG. 2B also illustrates the filter characteristics in FIG. 14B, which is the comparative example, for comparison. As is apparent from FIG. 2B, for instance, in a band at least 2 GHz, the filter characteristics are improved by about 3 dB.

Figure 3A:
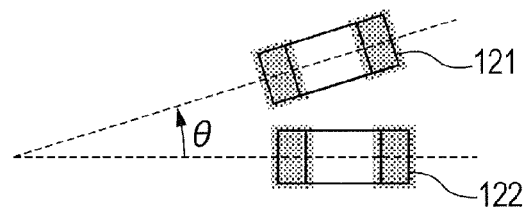
FIGS. 3A and 3B are diagrams illustrating a relationship between a first capacitor element and a second capacitor element.
Figure 3B:
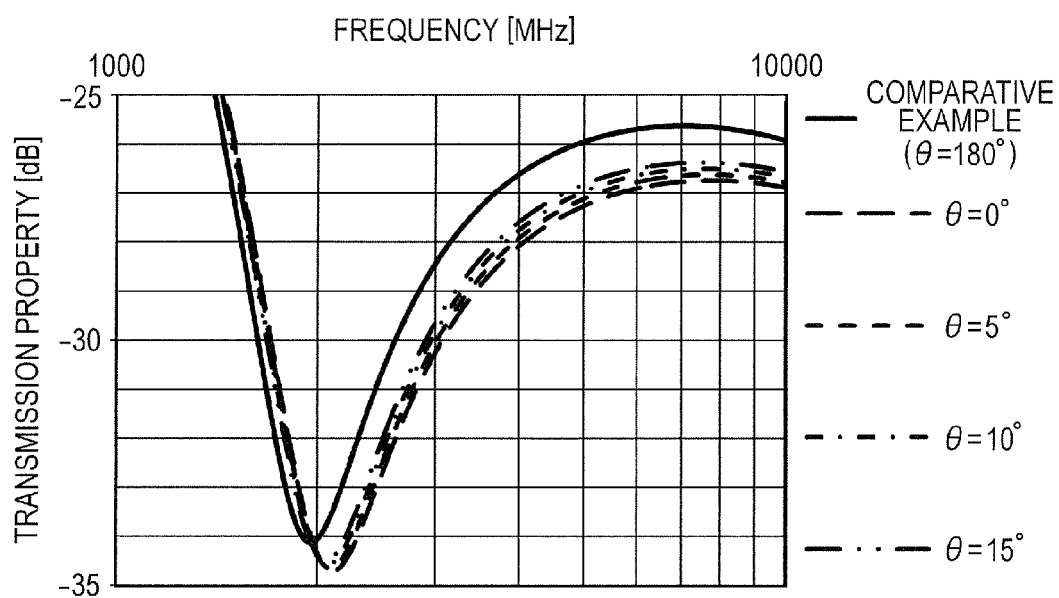

Here, the angle between the capacitor element 121 and the capacitor element 122 that are arranged parallel to each other will be described. FIGS. 3A and 3B are diagrams illustrating the relationship between the capacitor element 121 as the first capacitor element and the capacitor element 122 as the second capacitor element.

FIG. 3A illustrates the angle θ between the capacitor element 121 and the capacitor element 122. FIG. 3B illustrates variation in filter characteristics with variation of angle θ from 0° to 15° by increments of 5°. For comparison, the result in FIG. 14B of the comparative example is also illustrated.

At the angle θ=0°, the effective inductance $L_{eff}$ for the common mode currents is the minimum, and can most effectively suppress radiation noise. As the angle θ increases, the mutual inductance M decreases. Accordingly, the effective inductance $L_{eff}$ for the common mode currents becomes large. Referring to FIG. 3B, at least 1 dB can be secured on the amount of attenuation of the transmission property up to an angle θ=10° with respect to the comparative example. Accordingly, the allowance range of the angle between the parallel arranged capacitor elements 121 and 122 can foe set to an angle θ from 0° to 10°.

As described above, this first embodiment adopts the arrangement where the mutual inductance between the parasitic inductance of the capacitor element 121 and the parasitic inductance of the capacitor element 122 has a negative value for the common mode currents. Accordingly, the radiation noise from the differential signal wiring patterns 181 and 182 and the cables 105 and 106 can be suppressed.

The terminal 141 of the capacitor element 121 and the terminal 144 of the capacitor element 122 face each other. The terminal 142 of the capacitor element 121 and the terminal 143 of the capacitor element 122 face each other.

Accordingly, the radiation noise can be suppressed while a high density packaging is achieved.

The wiring pattern 161 and the wiring pattern 171 are set to have the same length. Accordingly, the impedances of the wiring patterns 161 and 171 balance with each other, and the signal waveform is further stabilized.

As described above, according to this first embodiment, a high density packaging and symmetrically arranged wirings are achieved, and the effective inductance $L_{eff}$ for the common mode currents is reduced, which in turn reduces degradation in filter characteristics in a high frequency band. Accordingly, radiation noise can be suppressed.

Second Embodiment

Figure 4:
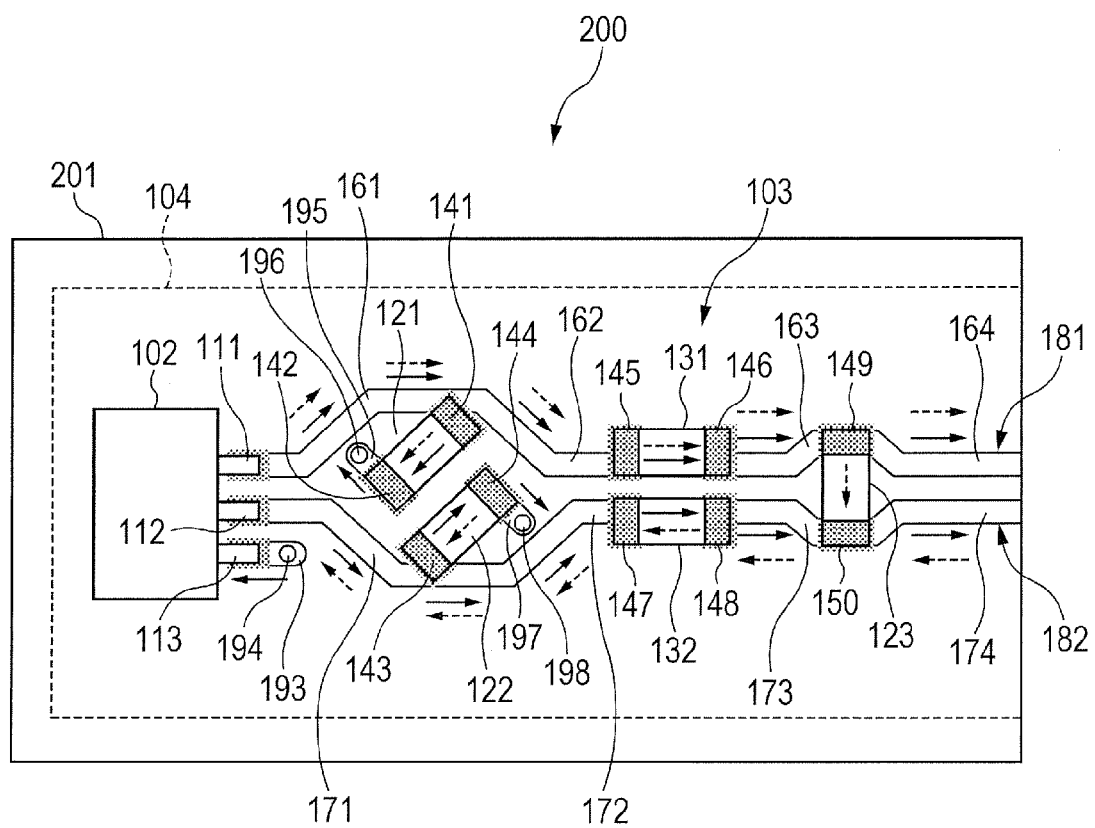
FIG. 4 is a plan view illustrating a schematic configuration of a printed circuit board according to a second embodiment.

Next, a printed circuit board according to a second embodiment of the present invention will be described. FIG. 4 is a plan view illustrating a schematic configuration of a printed circuit board according to the second embodiment of the present invention. In this second embodiment, the connection systems of the capacitor elements 121 and 122 to the solid ground pattern 104 at the terminals 142 and 144 are different from the system in the first embodiment. On the other configurational elements, the same symbols are assigned to parts having the same configurations as those of the first embodiment. The description thereof is omitted.

In this second embodiment, the printed circuit board 200 includes a printed wiring board 201, and the filter circuit 103 mounted on the printed wiring board. The printed wiring board 201 is a multilayer printed wiring board. The semiconductor element 102 and the filter circuit 103 are mounted on the surface layer of the printed wiring board 201. The solid ground pattern 104 is arranged in an inner layer; this layer is different from the surface layer.

The printed wiring board 201 includes a ground wiring pattern 195 as a first ground wiring pattern that is electrically connected to the terminal 142 of the capacitor element 121 and extends in a direction opposite to a side facing the capacitor element 122. That is, the ground wiring pattern 195 is arranged between the capacitor element 121 and the wiring pattern 161 of the differential signal wiring pattern 181. The ground wiring pattern 195 is arranged in the surface layer where the filter circuit 103 is mounted. The ground wiring pattern 195 is electrically connected to the solid ground pattern 104 through a via 196, which is a first via.

The printed wiring board 201 further includes a ground wiring pattern 197 as a second ground wiring pattern that is electrically connected to the terminal 144 of the capacitor element 122 and extends in a direction opposite to a side facing the capacitor element 121. That is, the ground wiring pattern 197 is arranged between the capacitor element 122 and the wiring pattern 172 of the differential signal wiring pattern 182. The ground wiring pattern 197 is arranged in the surface layer where the filter circuit 103 is mounted. The ground wiring pattern 197 is electrically connected to the solid ground pattern 104 through a via 198, which is a second via.

The differential mode current flows in the direction opposite to the capacitor element 121 in the wiring pattern 161, which is a section substantially parallel to the longitudinal direction of the capacitor element 121, in the differential signal wiring pattern 181.

Meanwhile, the differential mode current flows in the direction identical to the direction of the capacitor element 122 in the wiring pattern 172, which is a section substantially parallel to the longitudinal direction of the capacitor element 122, in the differential signal wiring pattern 162.

Thus, the differential mode currents in the capacitor elements 121 and 122 differently affect the differential mode currents flowing in the respective differential signal wiring patterns 181 and 182. As a result, the differential mode current is unbalanced to cause the common mode current.

In this second embodiment, the ground wiring pattern 195 resides between the capacitor element 121 and the wiring pattern 161. The ground wiring pattern 197 resides between the capacitor element 122 and the wiring pattern 172. These ground wiring patterns 195 and 197 weaken the coupling between the differential mode currents to suppress occurrence of the common mode currents.

There are no conductors, such as a wiring pattern and a via, between the capacitor element 121 and the capacitor element 122. Accordingly, the capacitor elements can be arranged closest to each other in a mounting constraint range. This arrangement increases occurrence of the mutual inductance with a negative value of −M, and can further improve the advantageous effect of reducing the effective inductance $L_{eff}$ for the common mode currents as described in the first embodiment.

Here, in the case where the capacitor elements 121 and 122 are arranged at an interval of 0.5 mm, the effective inductance is $L_{eff}$ calculated as 0.18 nH.

Figure 5A:
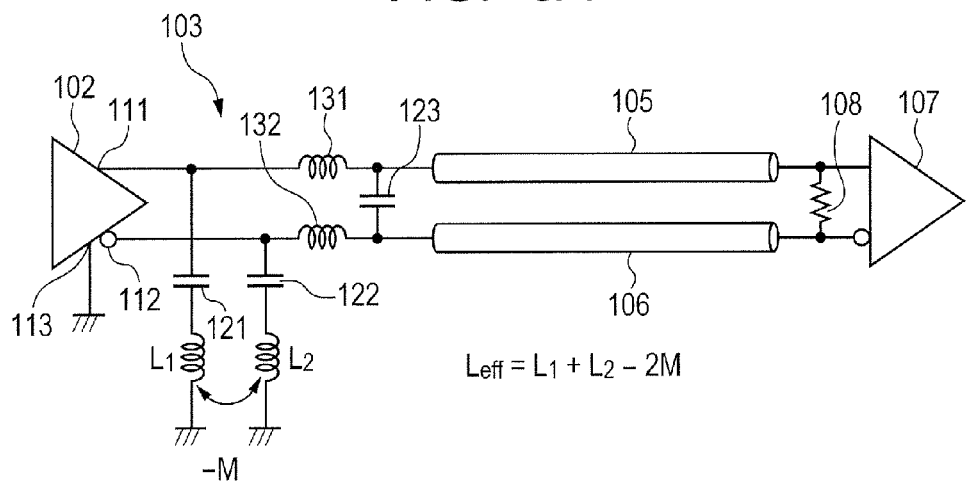
FIGS. 5A and 5B are diagrams for illustrating an operation of a differential signaling circuit of the second embodiment.
Figure 5B:
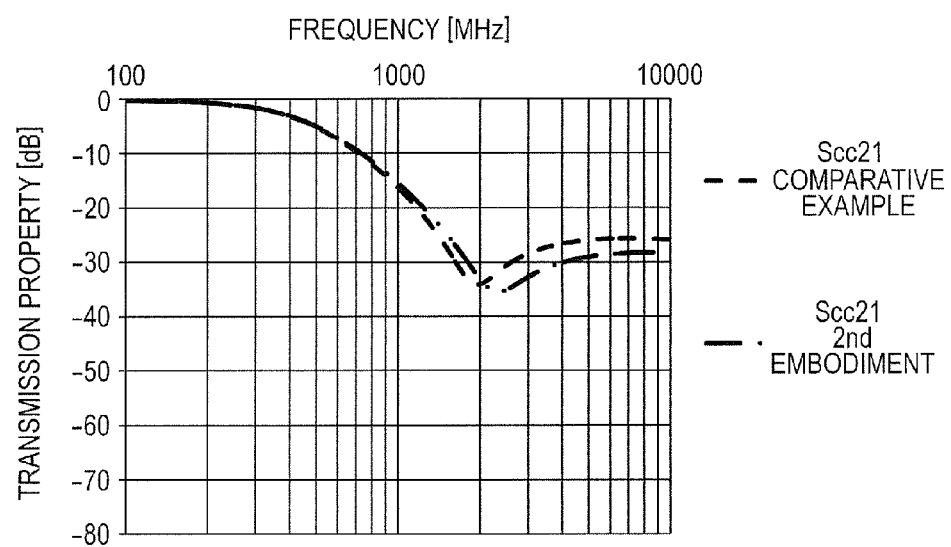

FIGS. 5A and 5B are diagrams for illustrating an operation of the differential signaling circuit in the second embodiment. FIG. 5A is an equivalent circuit diagram in consideration of the effective inductance $L_{eff}$ in the differential signaling circuit of the second embodiment. FIG. 5B is a graph illustrating the filter characteristics of the filter circuit (Scc21 property, i.e., the attenuation characteristics of the in-phase component) of the differential signaling circuit of the second embodiment. The filter circuit 103 of this second embodiment is a third order Bessel filter with a cutoff frequency of 500 MHz. The constants of the elements are configured such that the capacitor elements 121 and 122 have 14 pF, the capacitor element 123 has 1 pF, and the inductor elements 131 and 132 have 15.5 nH. A simulation on the equivalent circuit in FIG. 5A is performed using AnsoftDesigner by ANSYS, Inc. to calculate the filter characteristics.

FIG. 5B also illustrates the filter characteristics of FIG. 14B, which is the comparative example, for comparison. As is apparent from FIG. 5B, for instance, in a band at least 2 GHz, the filter characteristics are improved by about 5 dB.

As described above, according to this second embodiment, the effective inductance $L_{eff}$ for the common mode currents is further reduced, which in turn reduces degradation in filter characteristics in a high frequency band. Accordingly, radiation noise can be suppressed.

Third Embodiment

Figure 6:
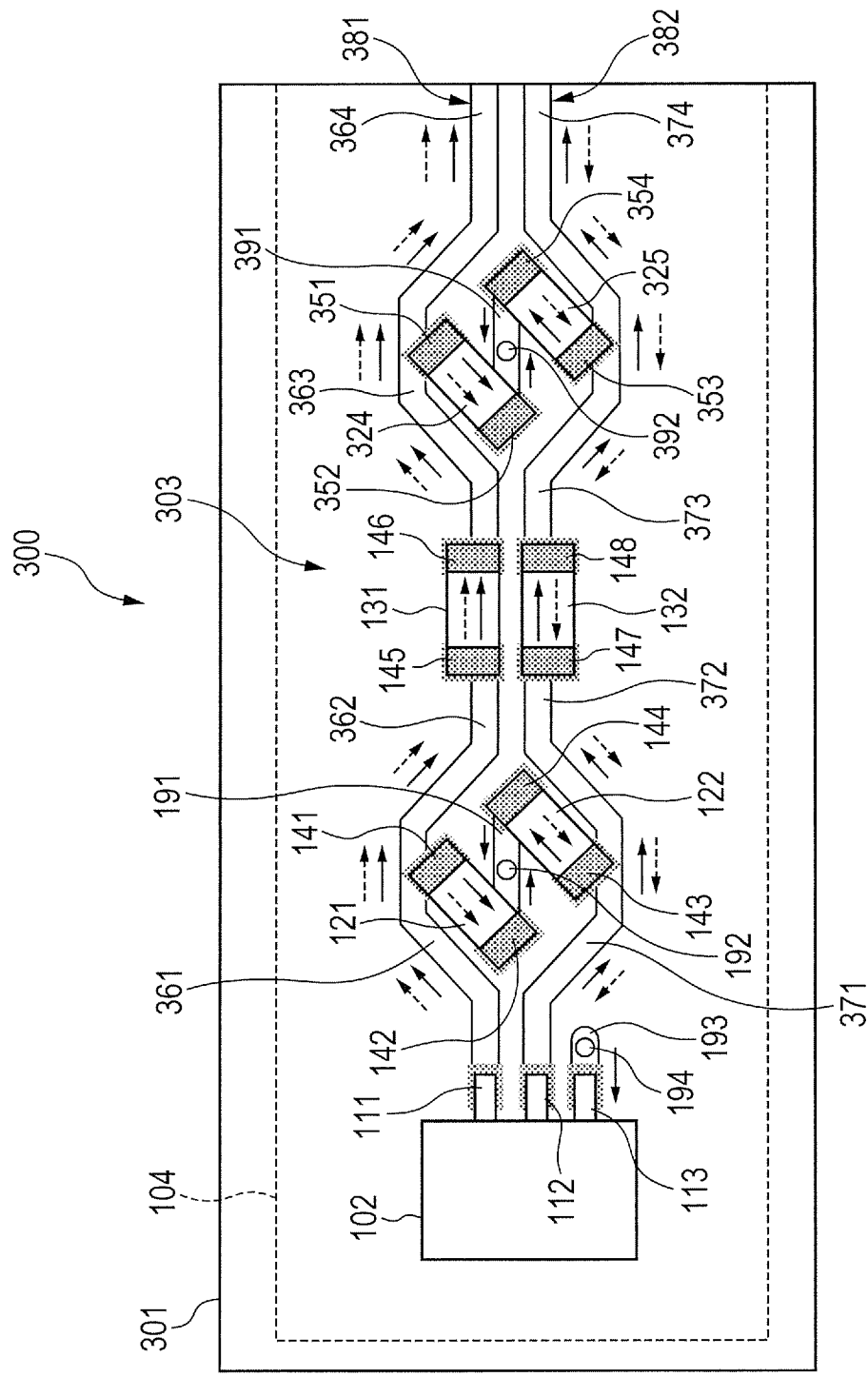
FIG. 6 is a plan view illustrating a schematic configuration of a printed circuit board according to a third embodiment.

Next, a printed circuit board according to a third embodiment of the present invention will be described. FIG. 6 is a plan view illustrating a schematic configuration of a printed circuit board according to the third embodiment of the present invention. In this third embodiment, the filter circuit has a configuration different from the configuration of the first embodiment. On the other configurational elements, the same symbols are assigned to parts having the same configurations as those of the first embodiment. The description thereof is omitted.

The printed circuit board 300 includes a printed wiring board 301, and the semiconductor element 102 and a filter circuit 303 that are mounted on the printed wiring board 301.

The printed wiring board 301 is a multilayer printed wiring board. The semiconductor element 102 and the filter circuit 303 are mounted on the surface layer on the printed wiring board 301. The solid ground pattern 104 is arranged in an inner layer that is a layer different from the surface layer of the printed wiring board 301.

In this third embodiment, the capacitor element 123 in the first embodiment is replaced with two capacitor elements 324 and 325. That is, the filter circuit 303 includes not only the capacitor elements 121 and 122 and the inductor elements 131 and 132 that are analogous to the elements of the first embodiment, but also a capacitor element 324 as a fourth capacitor element, and a capacitor element 325 as a fifth capacitor element. The capacitor elements 324 and 325 are, for instance, chip type capacitor elements.

In this third embodiment, the filter circuit 303 functions as a n-type low-pass filter connected to the terminals 111 and 112 of the semiconductor element 102. The capacitor elements 121 and 122 are capacitor elements on a signal input side for the respective inductor elements 131 and 132. The capacitor elements 324 and 325 are capacitor elements on a signal output side for the respective inductor elements 131 and 132. The filter circuit 303, which is a n-type low-pass filter, attenuates a harmonic component of the differential signal (differential current).

The capacitor element 324 includes: a terminal 351, which is an eleventh terminal; and a terminal 352, which is a twelfth terminal. The capacitor element 325 includes: a terminal 353, which is a thirteenth, terminal; and a terminal 354, which is a fourteenth terminal.

The printed wiring board 301 includes a wiring pattern (first signal wiring pattern) 361 formed of a conductor that electrically connects the signal output terminal 111 of the semiconductor element 102 to the terminal 141 of the capacitor element 121. The printed wiring board 301 includes a wiring pattern 362 formed of a conductor that electrically connects the terminal 141 of the capacitor element 121 to the terminal 145 of the inductor element 13. The printed wiring board 301 includes a wiring pattern 363 formed of a conductor that electrically connects the terminal 146 of the inductor element 131 to the terminal 351 of the capacitor element 324. The printed wiring board 301 includes a wiring pattern 364 formed of a conductor that electrically connects the terminal 351 of the capacitor element 324 to a connector terminal, not illustrated.

Furthermore, the printed wiring board 301 includes a wiring pattern (second signal wiring pattern) 371 formed of a conductor that electrically connects the signal output terminal 112 of the semiconductor element 102 to the terminal 143 of the capacitor element 121. The printed wiring board 301 further includes a wiring pattern 372 formed of a conductor that connects the terminal 143 of the capacitor element 122 to the terminal 147 of the inductor element 132. The printed wiring board 301 further includes a wiring pattern 373 formed of a conductor that electrically connects the terminal 148 of the inductor element 132 to the terminal 353 of the capacitor element 325. The printed wiring board 301 further includes a wiring pattern 374 formed of a conductor that electrically connects the terminal 353 of the capacitor element 325 to a connector terminal, not illustrated.

These wiring patterns 361 to 364 configure a differential signal wiring pattern 381 (first differential signal wiring pattern). The wiring patterns 371 to 374 configure a differential signal wiring pattern 382 (second differential signal wiring pattern). The differential signal wiring pattern 381 and the differential signal wiring pattern 382 are formed line-symmetrically to each other. The differential signal wiring patterns 381 and 382 are arranged in the surface layer of the printed wiring board 301.

As with the first embodiment, a connector terminal (not illustrated) of the printed wiring board 301 is electrically connected to a semiconductor element that receives the differential signal through the cable. Accordingly, the differential signal output from the semiconductor element 102 is transmitted to the semiconductor element on the reception side through the cable.

In this third embodiment, the capacitor elements 324 and 325 are arranged between the differential signal wiring patterns 381 and 382. Thus, the capacitor element 324 and the capacitor element 325 are arranged close to each other.

The printed wiring board 301 is arranged in the surface layer, and includes a ground wiring pattern 391 that electrically connects the terminal 352 of the capacitor element 324 to the terminal 354 of the capacitor element 325. The ground wiring pattern 391 is electrically connected to the solid ground pattern 104 by a via 392.

According to the above configuration, the terminal 351 of the capacitor element 324 is electrically connected to the signal output terminal 111 of the semiconductor element 102 through the inductor element 131, and the terminal 352 is electrically connected to the ground terminal 113 of the semiconductor element 102. The terminal 353 of the capacitor element 325 is electrically connected to the signal output terminal 112 of the semiconductor element 102 through the inductor element 132, and the terminal 354 is electrically connected to the ground terminal 113 of the semiconductor element 102. Accordingly, the capacitor element 324 can return the common mode current included in the signal output terminal 111 of the semiconductor element 102 to the ground terminal 113 of the semiconductor element 102. The capacitor element 325 can return the common mode current included in the signal output from the signal output terminal 112 of the semiconductor element 102 to the ground terminal 113 of the semiconductor element 102.

Here, the capacitor elements 324 and 325 have not only a capacitance component but also an inductance component due to a parasitic inductance. Thus, the capacitor elements 324 and 325 are arranged with respect to the common mode currents flowing through the respective capacitor elements 324 and 325 such that the mutual inductance between the parasitic inductance of the capacitor element 324 and the parasitic inductance of the capacitor element 325 is a negative value.

In this third embodiment, the capacitor elements 324 and 325 are arranged such that the terminal 351 of the capacitor element 324 and the terminal 354 of the capacitor element 325 face to each other, and the terminal 352 of the capacitor element 324 and the terminal 353 of the capacitor element 325 face to each other.

Accordingly, since the mutual inductance between the parasitic inductance of the capacitor element 324 and the parasitic inductance of the capacitor element 325 with respect to the common mode currents indicated by the solid line arrows is the negative value, the combined inductance for the common mode currents is reduced. Accordingly, the common mode currents are facilitated to return to the ground terminal 113 of the semiconductor element 102 through the respective capacitor elements 324 and 325. The radiation noise from the differential signal wiring patterns 381 and 382 and cables connected thereto can be suppressed.

That is, in FIG. 6, while the differential mode current, i.e., filter characteristics for the signal waveform are equivalent to characteristics of the first embodiment, the capacitor elements 324 and 325 function to return the common mode currents to the ground terminal 113 of the semiconductor element 102. Accordingly, the filter circuit 303 in this third embodiment can further improve the filter characteristics.

Here, for instance, in the case where the capacitor element 121 and the capacitor element 122 and the capacitor element 324 and the capacitor element 325 are arranged at intervals of 1 mm, the effective inductance $L_{eff}$ is calculated as 0.217 nH.

Figure 7A:
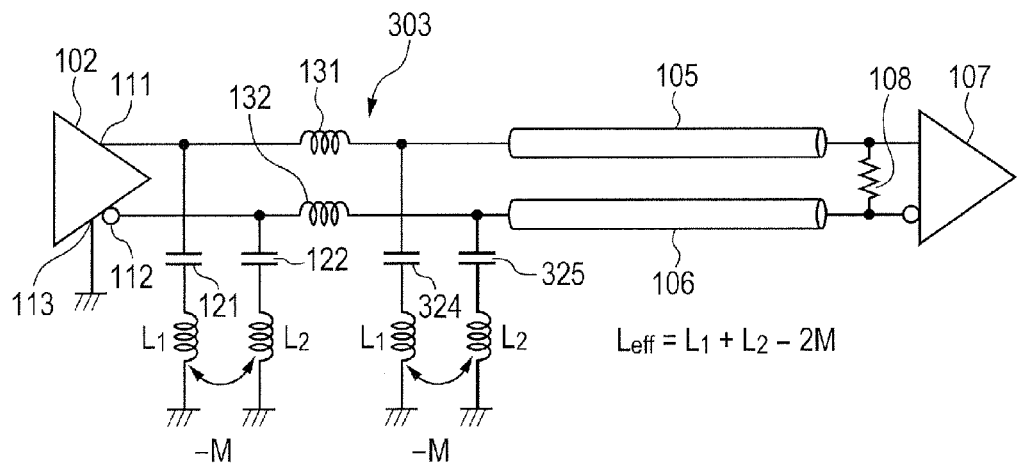
FIGS. 7A and 7B are diagrams for illustrating an operation of a differential signaling circuit of the third embodiment.
Figure 7B:
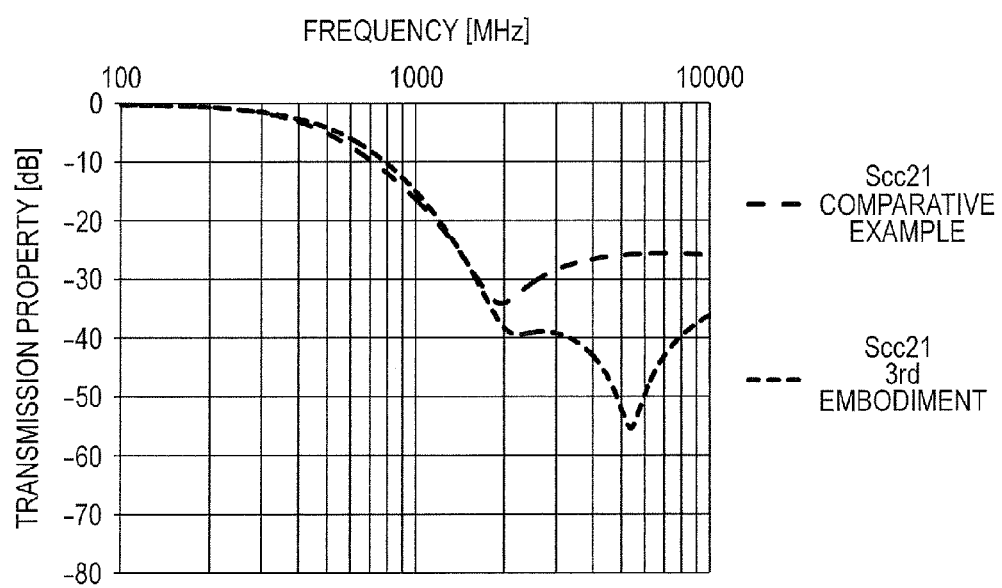

FIGS. 7A and 7B are diagrams for illustrating an operation of the differential signaling circuit in the third embodiment. FIG. 7A is an equivalent circuit diagram in consideration of the effective inductance $L_{eff}$ in the differential signaling circuit in the third embodiment. FIG. 7B is a graph illustrating the filter characteristics of the filter circuit (Scc21 property, i.e., the attenuation characteristics of the in-phase component) of the differential signaling circuit of the third embodiment. The filter circuit 303 of this third embodiment is a third order Bessel filter with a cutoff frequency of 500 MHz. The constants of the elements are configured such that the capacitor elements 121 and 122 have 14 pF, the capacitor elements 324 and 325 have 2 pF, and the inductor elements 131 and 132 have 15.5 nH. A simulation on the equivalent circuit in FIG. 7A is performed using AnsoftDesigner by ANSYS, Inc. to calculate the filter characteristics.

As with the first embodiment, the differential signal wiring patterns 381 and 382 are electrically connected to the semiconductor element 107 that receives the differential signals through the cables 105 and 106. Accordingly, the differential signals output from the semiconductor element 102 are transmitted to the semiconductor element 107 on the reception side through the cables 105 and 106.

FIG. 7B also illustrates the filter characteristics in FIG. 14B of the comparative example for comparison. As is apparent from FIG. 7B, for instance, the filter characteristics are improved at least 6 dB and about 30 dB at the maximum in a band at least 2 GHz.

The connection structure of the capacitor elements 324 and 325 to the solid ground pattern 104 may be analogous to the connection structure of the capacitor elements 121 and 122 of the second embodiment to the solid ground pattern 104.

As described above, according to this third embodiment, a high density packaging and symmetrically arranged wirings are achieved, and the effective inductance $L_{eff}$ for the common mode currents is reduced, which in turn reduces degradation in filter characteristics in a high frequency band. Accordingly, radiation noise can be suppressed.

The filter circuit 303 can further suppress radiation noise in comparison with the filter circuit 303 in the first and second embodiments.

Fourth Embodiment

Figure 8A:
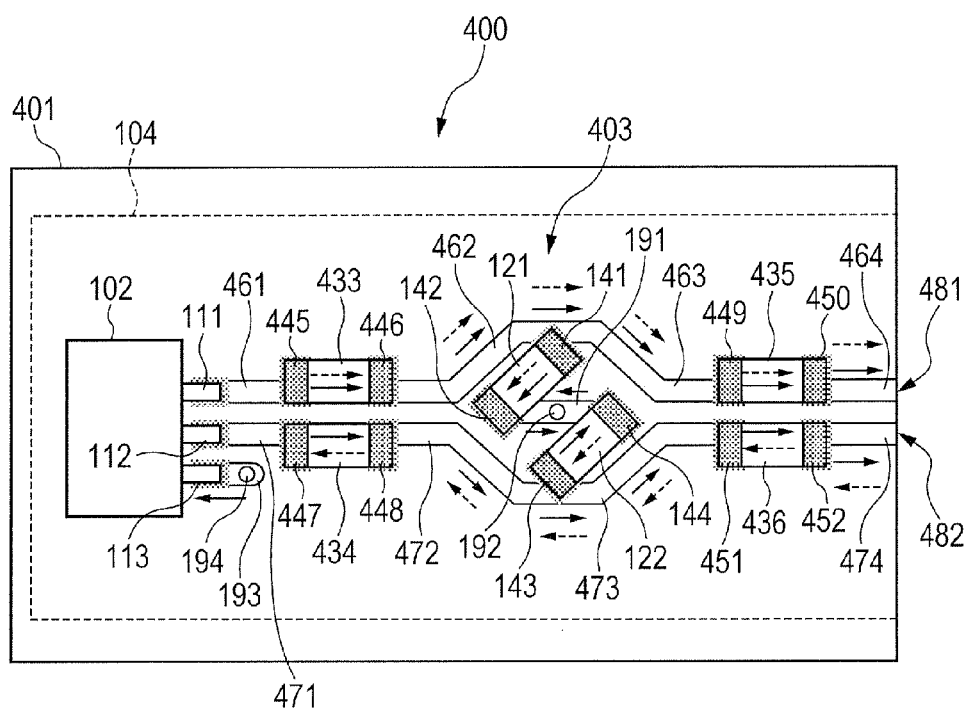
FIGS. 8A and 8B are diagrams illustrating a schematic configuration of a printed circuit board according to a fourth embodiment.
Figure 8B:
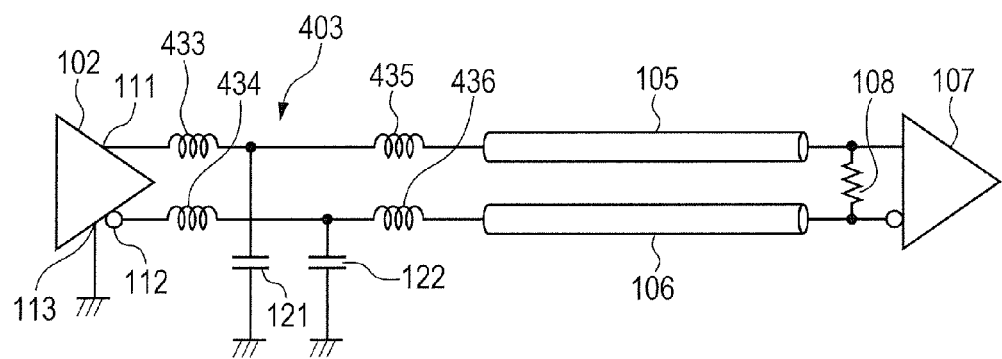

Next, a printed circuit, board according to a fourth embodiment of the present invention will be described. FIGS. 8A and 8B are diagrams illustrating a schematic configuration of the printed circuit board according to the fourth embodiment of the present invention. FIG. 8A is a plan view illustrating the printed circuit board. FIG. 8B is a circuit diagram illustrating a differential signaling circuit including semiconductor elements and a filter circuit that are mounted on a printed wiring board. In this fourth embodiment, the filter circuit has a configuration different from the configuration of the first embodiment. On the other configurational elements, the same symbols are assigned to parts having the same configurations as those of this first embodiment. The description thereof is omitted.

In FIG. 8A, the printed circuit board 400 includes: a printed wiring board 401; the semiconductor element 102 mounted on the printed wiring board 401; and a filter circuit 403 mounted on the printed wiring board 401. The printed wiring board 401 is a multilayer printed wiring board. The semiconductor element 102 and the filter circuit 403 are mounted on the surface layer of the printed wiring board 401. The solid ground pattern 104 is arranged in an inner layer that is different from the surface layer of the printed wiring board 401.

In the first to third embodiments, the case where the filter circuit is a π-type low-pass filter has been described. Instead, the filter circuit may be a T-type low-pass filter.

In this fourth embodiment, the filter circuit 403 functions as a T-type low-pass filter connected to the terminals 111 and 112 of the semiconductor element 102. As with the first embodiment, the filter circuit 403 includes the capacitor elements 121 and 122. The filter circuit 403 further includes: an inductor element (third inductor element) 433; an inductor element (fourth inductor element) 434; an inductor element (fifth inductor element) 435; and an inductor element (sixth inductor element) 436. The inductor elements 433 to 436 are, for instance, chip type inductor elements. In this fourth embodiment, the inductor elements 433 and 434 are inductor elements on the signal input side for the respective capacitor elements 121 and 122. The inductor elements 435 and 436 are inductor elements on the signal output side for the respective capacitor elements 121 and 122. The filter circuit 403, which is the T-type low-pass filter, attenuates the harmonic component of the differential signal (differential current).

The inductor element 433 includes: a terminal 445, which is a fifteenth terminal; and a terminal 446, which is a sixteenth terminal. The inductor element 434 includes: a terminal 447, which is a seventeenth terminal; and a terminal 448, which is an eighteenth terminal. The inductor element 435 includes: a terminal 449, which is a nineteenth terminal; and a terminal 450, which is a twentieth terminal. The inductor element 436 includes: a terminal 451, which is a twenty-first terminal; and a terminal 452, which is a twenty-second terminal.

The printed wiring board 401 includes a wiring pattern 461 formed of a conductor that electrically connects the signal output terminal 111 of the semiconductor element 102 to the terminal 445 of the inductor element 433. The printed wiring board 401 further includes a wiring pattern (first signal wiring pattern) 462 formed of a conductor that electrically connects the terminal 446 of the inductor element 433 to the terminal 141 of the capacitor element 121. The printed wiring board 401 further includes a wiring pattern 463 formed of a conductor that electrically connects the terminal 141 of the capacitor element 121 to the terminal 449 of the inductor element 435. The printed wiring board 401 includes a wiring pattern 464 formed of a conductor that electrically connects the terminal 450 of the inductor element 435 to a connector terminal, not illustrated.

Moreover, the printed, wiring board 401 includes a wiring pattern 471 formed of a conductor that electrically connects the signal output terminal 112 of the semiconductor element 102 to the terminal 447 of the inductor element 434. The printed wiring board 401 further includes a wiring pattern (second signal wiring pattern) 472 formed of a conductor that electrically connects the terminal 448 of the inductor element 434 to the terminal 143 of the capacitor element 122. The printed wiring board 401 further includes a wiring pattern 473 formed of a conductor that electrically connects the terminal 143 of the capacitor element 122 to the terminal 451 of the inductor element 436. The printed wiring board 401 further includes a wiring pattern 474 formed of a conductor that electrically connects the terminal 452 of the inductor element 436 to a connector terminal, not illustrated.

The wiring patterns 461 to 464 configure a differential signal wiring pattern 481 (first differential signal wiring pattern). The wiring patterns 471 to 474 configure a differential signal wiring pattern 482 (second differential signal wiring pattern). The differential signal wiring pattern 481 and the differential signal wiring pattern 482 are formed line-symmetrically to each other. The differential signal wiring patterns 481 and 482 are arranged on the surface layer of the printed wiring board 401.

In this fourth embodiment, the line-symmetric configuration between the differential signal wiring pattern 481 and the differential signal wiring pattern 482 define that the lengths of the wiring pattern 462 and the wiring pattern 472 are the same. Accordingly, the impedances of the wiring patterns 462 and 472 (in particular, inductances) are the same.

A connector terminal, not illustrated, of the printed wiring board 401 is electrically connected to the semiconductor element 107 that receives the differential signals through a pair of cables 105 and 106, which are differential signaling lines illustrated in FIG. 8B. Accordingly, the differential signals output from the semiconductor element 102 are transmitted to the semiconductor element 107 through the cables 105 and 106.

In this fourth embodiment, the capacitor elements 121 and 122 are arranged between the differential signal wiring patterns 481 and 482. Thus, the capacitor element 121 and the capacitor element 122 are arranged close to each other.

The printed wiring board 401 is arranged on the surface layer, and includes a ground wiring pattern 191 that electrically connects the terminal 142 of the capacitor element 121 to the terminal 144 of the capacitor element 122. The ground wiring pattern 191 is electrically connected to the solid ground pattern 104 by the via 192.

That is, the terminal 141 of the capacitor element 122 is electrically connected to the signal output terminal 111 of the semiconductor element 102 through the inductor element 433. The terminal 142 is electrically connected to the ground terminal 113 of the semiconductor element 102. The terminal 143 of the capacitor element 122 is electrically connected to the signal output terminal 112 of the semiconductor element 102 through the inductor element 434. The terminal 144 is electrically connected to the ground terminal 113 of the semi conductor element 102. Accordingly, the capacitor element 121 can return the common mode current included in the signal output from the signal output terminal 111 of the semiconductor element 102 to the ground terminal 113 of the semiconductor element 102. The capacitor element 122 can return the common mode current included in the signal output from the signal output terminal 112 of the semiconductor element 102 to the ground terminal 113 of the semiconductor element 102.

Here, the capacitor elements 121 and 122 have not only the capacitance component but also an inductance component due to a parasitic inductance. Thus, the capacitor elements 121 and 122 are arranged such that the mutual inductance between the parasitic inductance of the capacitor element 121 and the parasitic inductance of the capacitor element 122 has a negative value for the common mode currents flowing through the respective capacitor elements 121 and 122.

In this fourth embodiment, the capacitor elements 121 and 122 are arranged such that the terminal 141 of the capacitor element 121 and the terminal 144 of the capacitor element 122 face each other, and the terminal 142 of the capacitor element 121 and the terminal 143 of the capacitor element 122 face each other.

Accordingly, since the mutual inductance between the parasitic inductance of the capacitor element 121 and the parasitic inductance of the capacitor element 122 for the common mode currents indicated by solid line arrows, the combined inductance for the common mode currents is reduced. Accordingly, the common mode currents are facilitated to return to the ground terminal 113 of the semiconductor element 102 through the capacitor elements 121 and 122. The radiation noise from the differential signal wiring patterns 481 and 482 and the cables 105 and 106 can be suppressed.

Here, as with the first embodiment, in the case where the capacitor element 121 and the capacitor element 122 are arranged at an interval of 1 mm so as to avoid the ground wiring pattern 191 and the via 192, the effective inductance $L_{eff}$ is calculated as 0.217 nH.

Figure 9A:
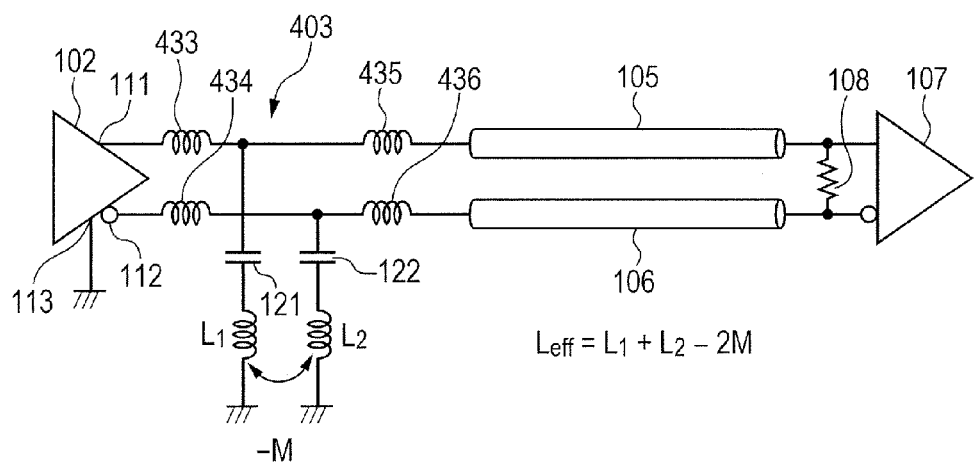
FIGS. 9A and 9B are diagrams for illustrating a differential signaling circuit of the fourth embodiment.
Figure 9B:
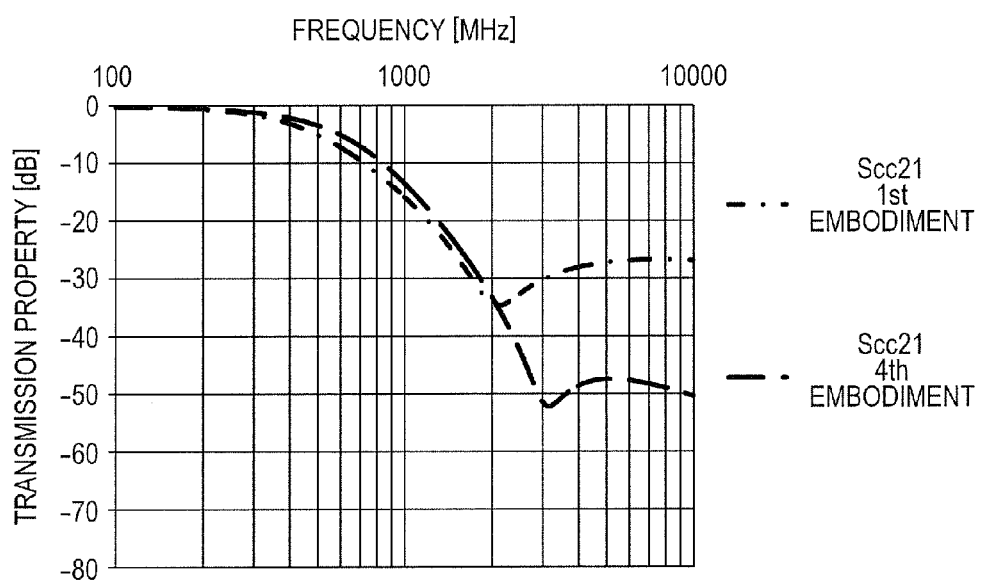

FIGS. 9A and 9B are diagrams for illustrating an operation of a differential signaling circuit of the fourth embodiment. FIG. 9A is an equivalent circuit diagram in consideration of the effective inductance $L_{eff}$ in the differential signaling circuit in the fourth embodiment. FIG. 9B is a graph illustrating the filter characteristics of the filter circuit (Scc21 property, i.e., the attenuation characteristics of the in-phase component) of the differential signaling circuit of the fourth embodiment. The filter circuit 403 of this fourth embodiment is a third order Bessel filter with a cutoff frequency of 500 MHz. The constants of the elements are configured such that the inductor elements 433 and 434 have 35 nH, the capacitor elements 121 and 122 have 6.2 pF, and the inductor elements 435 and 436 have 5.4 nH. A simulation on the equivalent circuit in FIG. 9A is performed using AnsoftDesigner by ANSYS, Inc. to calculate the filter characteristics.

FIG. 9B also illustrates the filter characteristics according to the equivalent circuit of the first embodiment, for comparison. As is apparent from FIG. 9B, for instance, in a band at least 2 GHz, the filter characteristics are further improved.

As described above, according to this fourth embodiment, the effective inductance $L_{eff}$ for the common mode currents is further reduced, which in turn reduces degradation in filter characteristics in a high frequency band. Accordingly, radiation noise can be suppressed.

Capacitance values used for the capacitor elements 121 and 122 range from 0.4 pF to 7 nF. Self-inductance values used for the inductor elements 433 to 436 range from 1 nH to 18 µH. Reasons of setting these ranges will be described. First, the reason of setting lower limits for the capacitor elements 121 and 122 and the inductor elements 433 to 436 is described. To achieve a higher cutoff frequency, the constants of the elements configuring the filter circuit 403 are required to be small. However, the smaller the constant of the element is, the higher the effect of the parasitic component of the element becomes. Accordingly, the desired pass band property cannot be achieved. That is, differential signal transmission waveform is distorted. The upper limit of the cutoff frequency for preventing occurrence of the distortion is set such that the minimum values of the respective elements for achieving 2.5 GHz are regarded as lower limits. Next, the reason of setting upper limits for the capacitor elements 121 and 122 and the inductor elements 433 to 436 is described. Since radiation noise causes a problem, the lower limit of the frequency of the signal to which the filter circuit 403 is required to be applied is about 1 MHz. The maximum values of the respective elements used to achieve this cutoff frequency of 1 MHz are defined as the upper limits. The range of the values are determined in consideration of the configurations of two types, which are the n-type and T-type. As described above, such setting of the constants of the elements can further effectively suppress radiation noise.

Fifth Embodiment

Next, a printed circuit board according to a fifth embodiment of the present invention will be described. FIG. 10 is a plan view illustrating a schematic configuration of the printed circuit board according to the fifth embodiment of the present invention. In this fifth embodiment, the connection system of the capacitor elements 121 and 122 to the solid ground pattern 104 at the respective terminals 142 and 144 are different from the system in the fourth embodiment. On the other configurational elements, the same symbols are assigned to parts having the same configurations as those of this fourth embodiment. The description thereof is omitted.

In this fifth embodiment, the printed circuit board 500 includes a printed wiring board 501, and a filter circuit 403 mounted on the printed wiring board. The printed wiring board 501 is a multilayer printed wiring board. The semiconductor element 102 and the filter circuit 403 are mounted on the surface layer of the printed wiring board 501. The solid ground pattern 104 is arranged in an inner layer; this layer is different from the surface layer of the printed wiring board 501.

The printed wiring board 501 includes a ground wiring pattern 595 as a second ground wiring pattern that is electrically connected to the terminal 142 of the capacitor element 121 and extends in the direction opposite to the side facing to the capacitor element 122. That is, the ground wiring pattern 595 is arranged between the capacitor element 121 and the wiring pattern 462 of the differential signal wiring pattern 481. The ground wiring pattern 595 is arranged in the surface layer where the filter circuit 403 is mounted. The ground wiring pattern 595 is electrically connected to the solid ground pattern 104 through a via 596, which is the first via.

The printed wiring board 501 further includes a ground wiring pattern 597 as the second ground wiring pattern that is electrically connected to the terminal 144 of the capacitor element 122 and extends in the direction opposite to the side facing the capacitor element 121. That is, the ground wiring pattern 597 is arranged between the capacitor element 122 and the wiring pattern 472 of the differential signal wiring pattern 482. The ground wiring pattern 497 is arranged in the surface layer where the filter circuit 403 is mounted. The ground wiring pattern 497 is electrically connected to the solid ground pattern 104 through a via 598, which is the second via.

The differential mode current flows in the direction opposite to the capacitor element 121 in the wiring pattern 462, which is a section substantially parallel to the longitudinal direction of the capacitor element 121, in the differential signal wiring pattern 481.

Meanwhile, the differential mode current flows in the direction identical to the direction of the capacitor element 122 in the wiring pattern 473, which is a section substantially parallel to the longitudinal direction of the capacitor element 122, in the differential signal wiring pattern 482.

Thus, the differential mode currents in the capacitor elements 121 and 122 differently affect the differential mode currents flowing in the respective differential signal wiring patterns 481 and 482. As a result, the differential mode current is unbalanced to cause the common mode current.

In this fifth embodiment, the ground wiring pattern 595 resides between the capacitor element 121 and the wiring pattern 462. The ground wiring pattern 597 resides between the capacitor element 122 and the wiring pattern 473. These ground wiring patterns 595 and 597 weaken the coupling between the differential mode currents to suppress occurrence of the common mode currents.

There are no conductors, such as a wiring pattern and a via, between the capacitor element 121 and the capacitor element 122. Accordingly, the capacitor elements can be arranged closest to each other in a mounting constraint range. This arrangement increases occurrence of the mutual inductance with a negative value of −M, and can further improve the advantageous effect of reducing the effective inductance $L_{eff}$ for the common mode currents as described in the fourth embodiment.

Here, as with the second embodiment, in the case where the capacitor elements 121 and 122 are arranged at an interval of 0.5 mm, the effective inductance $L_{eff}$ is calculated as 0.18 nH.

Figure 11A:
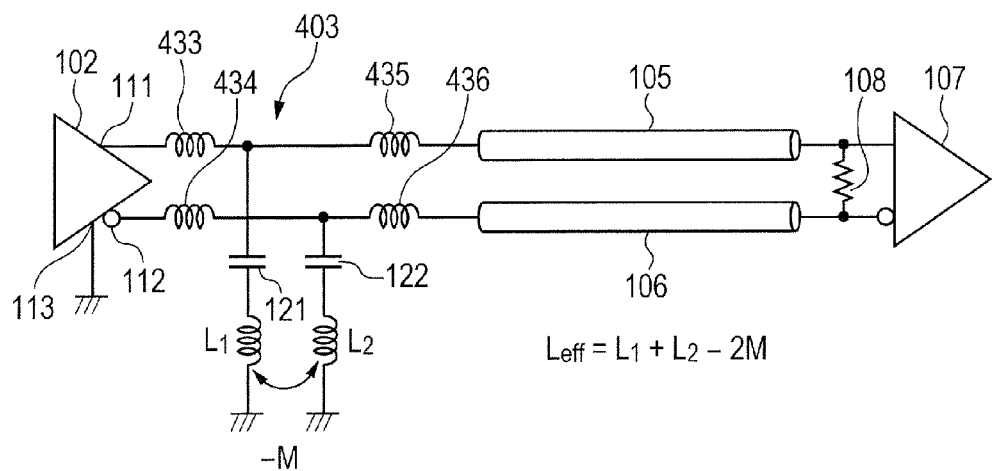
FIGS. 11A and 11B are diagrams for illustrating an operation of a differential signaling circuit of the fifth embodiment.
Figure 11B:
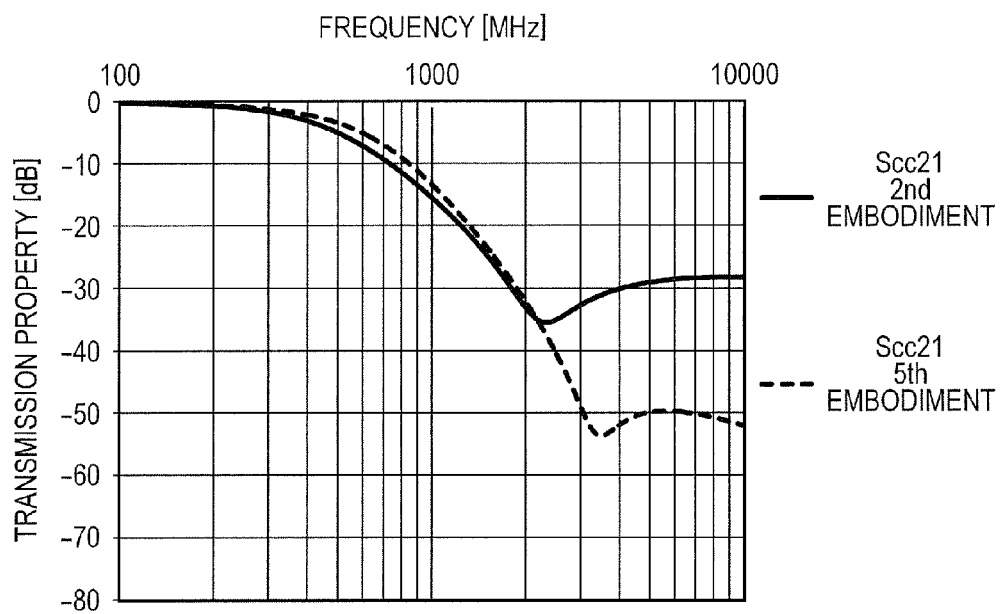

FIGS. 11A and 11B are diagrams for illustrating an operation of the differential signaling circuit in the fifth embodiment. FIG. 11A is an equivalent circuit diagram in consideration of the effective inductance $L_{eff}$ in the differential signaling circuit of the fifth embodiment. FIG. 11B is a graph illustrating the filter characteristics of the filter circuit (Scc21 property, i.e., the attenuation characteristics of the in-phase component) of the differential signaling circuit of the fifth embodiment. The filter circuit 403 of this fifth embodiment is a third order Bessel filter with a cutoff frequency of 500 MHz. The constants of the elements are configured such that the inductor elements 433 and 434 have 35 nH, the capacitor elements 121 and 122 have 6.2 pF, and the inductor elements 435 and 436 have 5.4 nH. A simulation on the equivalent circuit in FIG. 11A is performed using AnsoftDesigner by ANSYS, Inc. to calculate the filter characteristics.

FIG. 11B also illustrates the filter characteristics according to the equivalent circuit of the second embodiment, for comparison. As is apparent from FIG. 11B, for instance, in a band at least 2 GHz, the filter characteristics are further improved.

As described above, according to this fifth embodiment, the effective inductance $L_{eff}$ for the Common mode currents is further reduced, which in turn reduces degradation in filter characteristics in a high frequency band. Accordingly, radiation noise can be suppressed.

The present invention is not limited to the embodiments having been described above. Instead, many variations can be achieved by any person having ordinary skill within the technical thought of the present invention.

In the first to fifth embodiments, the case where the terminals of the capacitor elements 121 and 122 face each other has been described. However, the mounting is not limited to this configuration. Instead, another arrangement of the capacitor elements 121 and 122 can be adopted only if the mutual inductance between the capacitor elements 121 and 122 is a negative value.

In the first to fifth embodiments, the cases where the transmission semiconductor element 102 and the reception semiconductor element 107 are mounted on the different printed wiring boards and electrically connected by the cables 105 and 106 have been described. However, the configuration is not limited thereto. Even mounting where the semiconductor element 102 and the semiconductor element 107 are mounted on the same printed wiring board can exert analogous advantageous effects. In this case, the printed circuit board includes the printed wiring board, and the semiconductor elements 102 and 107 and the filter circuit that are mounted on the printed wiring board.

According to the present invention, in the first capacitor element and the second capacitor element that return the common mode currents to the ground terminal of the semiconductor element, the effective inductance to the common mode currents is reduced, which allows the radiation noise to be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-180464, filed Aug. 16, 2012, which is hereby incorporated by reference herein in its entirety.

What is claimed is:

1. A printed circuit board comprising:
   a printed wiring board;
   a semiconductor element mounted on the printed wiring board and having a ground terminal connected to a ground, and a first signal output terminal and a second signal output terminal outputting differential signals;
   a first differential signal wiring and a second differential signal wiring connected to the first and second signal output terminals of the semiconductor element, respectively, and transmitting differential signals;
   a first capacitor element arranged between the first differential signal wiring and a ground, and having a first terminal connected to the first differential signal wiring and a second terminal connected to a ground; and
   a second capacitor element arranged between the second differential signal wiring and a ground, and having a third terminal connected to the second differential signal wiring and a fourth terminal connected to a ground,
   wherein the first capacitor element and the second capacitor element are arranged side by side such that the first terminal of the first capacitor element and the fourth terminal of the second capacitor element face each other, and the second terminal of the first capacitor element and the third terminal of the second capacitor element face each other, and
   wherein the first capacitor element and the second capacitor element are arranged so that a first direction of a common mode current from the first terminal to the second terminal and a second direction of a common mode current from the third terminal to the fourth terminal are different from each other, and
   wherein a planar ground pattern having ground potential is formed in a layer different from a layer on which the semiconductor element is mounted, and the second terminal of the first capacitor element and the fourth terminal of the second capacitor element are connected to the planar ground pattern through a via.

2. The printed circuit board according to claim 1,
   wherein the first capacitor element and the second capacitor element are formed in an area between the first differential signal wiring and the second differential signal wiring.

3. The printed circuit board according to claim 1,
   wherein an angle of 0-10 degrees is formed between a line from the first terminal to the second terminal of the first capacitor element, and a line from the third terminal to the fourth terminal of the second capacitor element.

4. The printed circuit board according to claim 1,
   wherein when a signal is outputted from the first differential signal wiring to the first capacitor element, and when a signal is outputted from the second differential signal wiring to the second capacitor element, mutual inductance between parasitic self-inductances of the first and the second capacitor elements is negative value.

5. An electronic apparatus having the printed circuit board according to claim 1,
   wherein the first or the second differential signal wiring formed on the printed circuit board is connected to another semiconductor element through a cable.

6. The printed circuit board according to claim 1, further comprising:
   a first inductor element arranged on the first differential signal wiring at a side of a position connecting the first capacitor element opposite to a side of the first signal output terminal, and forming a portion of the first differential signal wiring;
   a second inductor element arranged on the second differential signal wiring at a side of a position connecting the second capacitor element opposite to a side of the second signal output terminal, and forming a portion of the second differential signal wiring; and
   a third capacitor element having one end connected to a side of the first inductor element, arranged on the first differential signal wiring, opposite to a side of the first signal output terminal, and having another end connected to a side of the second inductor element, arranged on the second differential signal wiring, opposite to a side of the second signal output terminal on the second differential signal wiring.

7. The printed circuit board according to claim 1, further comprising:
   a first inductor element arranged on the first differential signal wiring at a side of a position connecting the first capacitor element opposite to a side of the first signal output terminal, and forming a portion of the first differential signal wiring;
   a second inductor element arranged on the second differential signal wiring at a side of a position connecting the second capacitor element opposite to a side of the second signal output terminal, and forming a portion of the second differential signal wiring;
   a fourth capacitor element arranged between the first differential signal wiring and a ground at a side of the first inductor element, arranged on the first differential signal wiring, opposite to a side of the first signal output terminal, and having a fifth terminal connected to the first signal output terminal and a sixth terminal connected to a ground; and
   a fifth capacitor element arranged between the second differential signal wiring and a ground at a side of the second inductor element, arranged on the second differential signal wiring, opposite to a side of the second signal output terminal, and having a seventh terminal connected to the second signal output terminal and a eighth terminal connected to a ground, wherein the fourth capacitor element and the fifth capacitor element are arranged side by side such that the fifth terminal of the fourth capacitor element and the eighth terminal of the fifth capacitor element face each other, and the sixth terminal of the fourth capacitor element and the seventh terminal of the fifth capacitor element face each other.

8. The printed circuit board according to claim 1, wherein the first capacitor element and the second capacitor element are arranged so that a third direction of a differential mode current between the first terminal and the second terminal and a fourth direction of a differential mode current between the third terminal and the fourth terminal are the same as each other.

9. The printed circuit board according to claim 6, wherein the first capacitor element and the second capacitor element are formed in an area between the first differential signal wiring and the second differential signal wiring.

10. The printed circuit board according to claim 6, wherein an angle of 0-10 degrees is formed between a line from the first terminal to the second terminal of the first capacitor element, and a line from the third terminal to the fourth terminal of the second capacitor element.

11. The printed circuit board according to claim 6, wherein when a signal is outputted from the first differential signal wiring to the first capacitor element, and when a signal is outputted from the second differential signal wiring to the second capacitor element, mutual inductance between parasitic self-inductances of the first and the second capacitor elements is negative value.

12. An electronic apparatus having the printed circuit board according to claim 6, wherein the first or the second differential signal wirings formed on the printed circuit board is connected to another semiconductor element through a cable.

13. The printed circuit board according to claim 7, wherein the first capacitor element and the second capacitor element are formed in an area between the first differential signal wiring and the second differential signal wiring.

14. The printed circuit board according to claim 7, wherein an angle of 0-10 degrees is formed between a line from the first terminal to the second terminal of the first capacitor element, and a line from the third terminal to the fourth terminal of the second capacitor element, an angle of 0-10 degrees is formed between a line from the fifth terminal to the sixth terminal of the fourth capacitor element, and a line from the seventh terminal to the eighth terminal of the fifth capacitor element.

15. The printed circuit board according to claim 7, wherein when a signal is outputted from the first differential signal wiring to the fourth capacitor element, and when a signal is outputted from the second differential signal wiring to the fifth capacitor element, mutual inductance between parasitic self-inductances of the fourth and the fifth capacitor elements is negative value.

16. The printed circuit board according to claim 7, wherein the planar ground pattern having ground potential is formed in a layer different from a layer on which the semiconductor element is mounted, and the second terminal of the first capacitor element, the fourth terminal of the second capacitor element, the sixth terminal of the fourth capacitor element and the eighth terminal of the fifth capacitor element are connected to the planar ground pattern through the via.

17. An electronic apparatus having the printed circuit board according to claim 7, wherein the first or the second differential signal wirings formed on the printed circuit board is connected to another semiconductor element through a cable.

* * * * *